US006812792B2

(12) United States Patent
Mattsson et al.

(10) Patent No.: US 6,812,792 B2
(45) Date of Patent: Nov. 2, 2004

(54) PRECORRECTION OF A NONLINEAR AMPLIFIER

(75) Inventors: Anders S. Mattsson, Mason, OH (US); Carlos Abascal, Middletown, OH (US); Wayne Duello, Hamilton, OH (US); David Danielssons, Maineville, OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/335,772

(22) Filed: Jan. 2, 2003

(65) Prior Publication Data

US 2004/0130394 A1 Jul. 8, 2004

(51) Int. Cl.[7] .......................... H03F 1/30; G01R 19/00
(52) U.S. Cl. ........................................ 330/149; 330/2
(58) Field of Search ..................................... 330/149, 2

(56) References Cited

U.S. PATENT DOCUMENTS

| | | | |
|---|---|---|---|
| 4,291,277 A | | 9/1981 | Davis et al. |
| 5,170,495 A | * | 12/1992 | McNicol et al. ............ 455/116 |
| 5,534,820 A | | 7/1996 | Tupper et al. |
| 5,850,162 A | | 12/1998 | Danielsons |
| 5,898,338 A | | 4/1999 | Proctor et al. |
| 5,900,778 A | | 5/1999 | Stonick et al. |
| 5,959,499 A | | 9/1999 | Khan et al. |
| 6,046,635 A | * | 4/2000 | Gentzler ..................... 330/149 |
| 6,054,895 A | | 4/2000 | Danielsons et al. |
| 6,081,158 A | | 6/2000 | Twitchell et al. |
| 6,104,239 A | | 8/2000 | Jenkins |
| 6,175,270 B1 | * | 1/2001 | Vannucci ....................... 330/2 |
| 6,356,146 B1 | * | 3/2002 | Wright et al. .................. 330/2 |
| 6,388,518 B1 | * | 5/2002 | Miyatani .................... 330/149 |

OTHER PUBLICATIONS

Maria–Gabriella Di Benedetto and Paolo Mandarini A New Analog Predistortion Criterion with Application to High Efficiency Digital Radio Links, IEEE Transactions on Communications, vol. 43, No. 12, pp. 2966–2974, Dec. 1995.
Giovanni Lazzarin, Silvano Pupolin and Augusto Sarti Nonlinearity Compensation in Digital Radio Systems, Transactions on Communications, vol. 42, No. 2/3/4, pp. 988–999, Feb./Mar./Apr. 1994.
Aldo N. D'Andrea, Vincenzo Lottici and Ruggero Reggiannini RF Power Amplifier Linearization Through Amplitude and Phase Predistortion, IEEE Transactions on Communications, vol. 44, No. 11, pp. 1477–1484, Nov. 1996.
Kurt Metzger and Rolf Valentin Intersymbol Interference Due to Linear and Nonlinear Distortion, IEEE Transactions on Communications, vol. 44, No. 7, pp. 809–816, Jul. 1996.
Georges Karam and Hikmet Sari A Data Predistortion Technique with memory for QAM Radio Systems, IEEE Transactions on Communications, vol. 39, No. 2, pp. 336–344, Feb. 1991.
Georges Karam and Hikemet Sari Analysis of Predistortion, Equalization, and ISI Cancellation Techniques in Digital Radio System with Nonlinear Transmit, Amplifiers, IEEE Transactions on Communications, vol. 37, No. 12, pp. 1245–1253, Dec. 1989.

(List continued on next page.)

*Primary Examiner*—Patricia Nguyen
(74) *Attorney, Agent, or Firm*—Tarolli, Sundheim, Covell & Tummino L.L.P.

(57) ABSTRACT

A method and apparatus are disclosed for predistorting an input signal to a non-linear amplifier. An appropriate precorrection is determined for the input signal over a series of iterative stages according to an amplifier model. The amplifier model includes a limiting function that clips the input signal to reduce error due to amplifier saturation. The determined precorrection is then applied to the input signal.

32 Claims, 8 Drawing Sheets

OTHER PUBLICATIONS

Lars Sundstrom, Michael Faulkner and Mats Johansson Quantization Analysis and Design of a Digital Predistortion Linearizer for RF Power Amplifiers, IEEE Transactions on Vehicular Technology, vol. 45, No. 4, pp. 707–719, Nov. 1996.

M. Ghaderi, S. Kumar and D. E. Dodds Adaptive Predistortion Lineariser Using Polynomical Functions, IEEE Proceedings on Communications, vol. 141, No. 2, pp. 49–55, Apr. 1994.

Kathleen J. Muhonen, Mohsen Kavehrad, Rajeev Krishnamoorthy, Look–up Table Techniques for Adaptive Digital Predistortion: A Devlopment and Comparison, IEEE Transactions on Vehicular Technology, vol. 49, No. 5, Sep. 2000.

Alberto Carini, V. John Matthews and Giovanni L. Sicuranza Exact and PTH Order Equalization and Linearization of Recursive Polynomial Systems, Proc. Third Annual Asilomor Conference on signal systems and computing, Nov. 1998.

Alberto Carini, V. John Matthews and Giovanni L. Sicuranza Equalization of Recursive Polynomial Systems, IEEE Signal Processing Letters, vol. 6, No. 12, Dec. 1999.

P. Koukoulas and N. Kalouptsisis Second Order Volterra System Identification, IEEE Transactions on Signal Processing. Vo. 48, No. 12, Dec. 2000.

Chi–Hao Cheng and Edvard J. Powers Optimal Volterra Kernal Estimation Algorithm for Nonlinear Communications System for PSK and QAM Inputs, IEEE Transactions on Signal Processing, vol. 49, No. 1, Jan. 2001.

Wolfgang Busch Measurements and Simulation of Memory Effects in Pre–Distortion Linearizers, IEEE Transactions on Microwave Theory and Technique, vol. 37, No. 12, Dec. 1989.

Hassan K. Khalil Non–Linear Systems, Macmillan Publishing Company, New York, 1992, pp. 211–217.

* cited by examiner

PRECORRECTION OF A NONLINEAR AMPLIFIER

BACKGROUND OF THE INVENTION

1. Field of the Invention

This invention relates to the field of signal correction in a communication system, and, more particularly, to precorrection of an information carrying input signal to a non-linear amplifier.

2. Description of the Prior Art

Correction for amplifiers has attracted a significant amount of interest recently, mainly due to increasingly strict requirements for spectral purity and demands for increased efficiency. With digital signal processing (DSP) circuits becoming less expensive and more powerful, predistortion of an information carrying signal has become a popular means of meeting these requirements.

Predistortion is relatively straightforward in a memoryless system. In a memoryless system, the output of the system at a given time depends solely on the input to the system at the given time. A solid first approximation of the characteristics of a memoryless amplifier can be provided by the transfer curves of the amplifier. Predistortion in such systems is well known in the art.

Most practical amplifiers, however, have memory, in the sense that prior inputs have an effect on the present output. Such a system can be only roughly approximated by memoryless system. One approach for dealing with non-linear systems with memory involves the Volterra series. When dealing with high power amplifiers, however, the limitations of the Volterra series become apparent; under present theory, a finite Volterra series can not handle the saturation that plagues any practical amplifier.

Efforts have been made to work around this limitation, but these efforts have achieved only limited success. One system was described at the Thirty-Second Annual Asilomar Conference on Signals, Systems, and Computing under the title "Exact and pth Order Equalization and Linearization of Recursive Polynomial Systems." The system is shown to be capable of approximating non-linear systems with memory using the Volterra series. The derived model, however, is effective only for systems in which the amplifier model is of general minimum phase type. By "general phase type", it is meant that the error is leading the signal, much as in a linear system that is non-minimum phase. Such a limitation is impractical for many applications.

SUMMARY OF THE INVENTION

To overcome the limitations discussed above, an apparatus is provided for precorrection of non-linear amplifiers, in particular those with memory. To this end, a method is disclosed for predistorting an input signal to a non-linear amplifier. An appropriate precorrection is determined for the input signal over a series of iterative stages according to an amplifier model. The amplifier model includes a limiting function that clips the input signal to reduce error due to amplifier saturation. The determined precorrection is then applied to the delayed input signal.

In accordance with another aspect of the invention, a method is disclosed for predistorting an input signal to a non-linear amplifier. An appropriate precorrection is determined for the input signal over a series of iterative stages, according to an amplifier model. The input signal is delayed between iterative stages. The determined precorrection is then applied to the delayed input signal.

In accordance with yet another aspect of the invention, an apparatus is disclosed for predistorting an input signal to a non-linear amplifier. The apparatus comprises a series of correction elements. Each of the correction elements includes a predistortion calculation portion that determines an appropriate precorrection for a signal input into the correction element in accordance with an amplifier model. The amplifier model includes a limiting function that clips the input signal to reduce error due to amplifier saturation. Each also includes a difference element that applies the determined precorrection to the delayed input signal.

In accordance with still another aspect of the invention, an apparatus is disclosed for predistorting an input signal to a non-linear amplifier. The apparatus comprises a series of correction elements. Each of the correction elements includes a predistortion calculation portion that determines an appropriate precorrection for a signal input into the correction element in accordance with an amplifier model. The correction elements also include a delay portion that delays the input signal. Additionally, each includes a difference element that applies the determined precorrection to the delayed input signal.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein.

DETAILED DESCRIPTION OF THE INVENTION

The predistorter of the present invention relies upon an iterative process to calculate and apply a predistortion to an information-carrying signal. For any practical amplifier, the iterative model will converge to provide an estimation of the predistortion necessary to correct for the distortion introduced by the amplifier. Further, this model may be improved almost indefinitely by the addition of more iterative stages and, with the addition of a delay, retains its effectiveness for amplifier models that lack general minimum phase characteristics.

The stability of the iterative model is maintained by including a soft-limiter function within the predistortion calculation. The soft-limiter function, in effect, compares the output of the amplifier to a clipped version of the original input. This allows the error to remain small near saturation levels, since the "error" is calculated as the difference between the output and this clipped version of the input. This has two advantages. To begin with, the error is kept small so that the iterative predistorter will converge, as convergence is only possible in a system where the error is bounded. Secondly, since a saturating amplifier is not invertable in a mathematical sense, avoiding saturation through the soft-limiter allows mathematical modeling of the inverse to remain a tractable problem.

Figure 1:
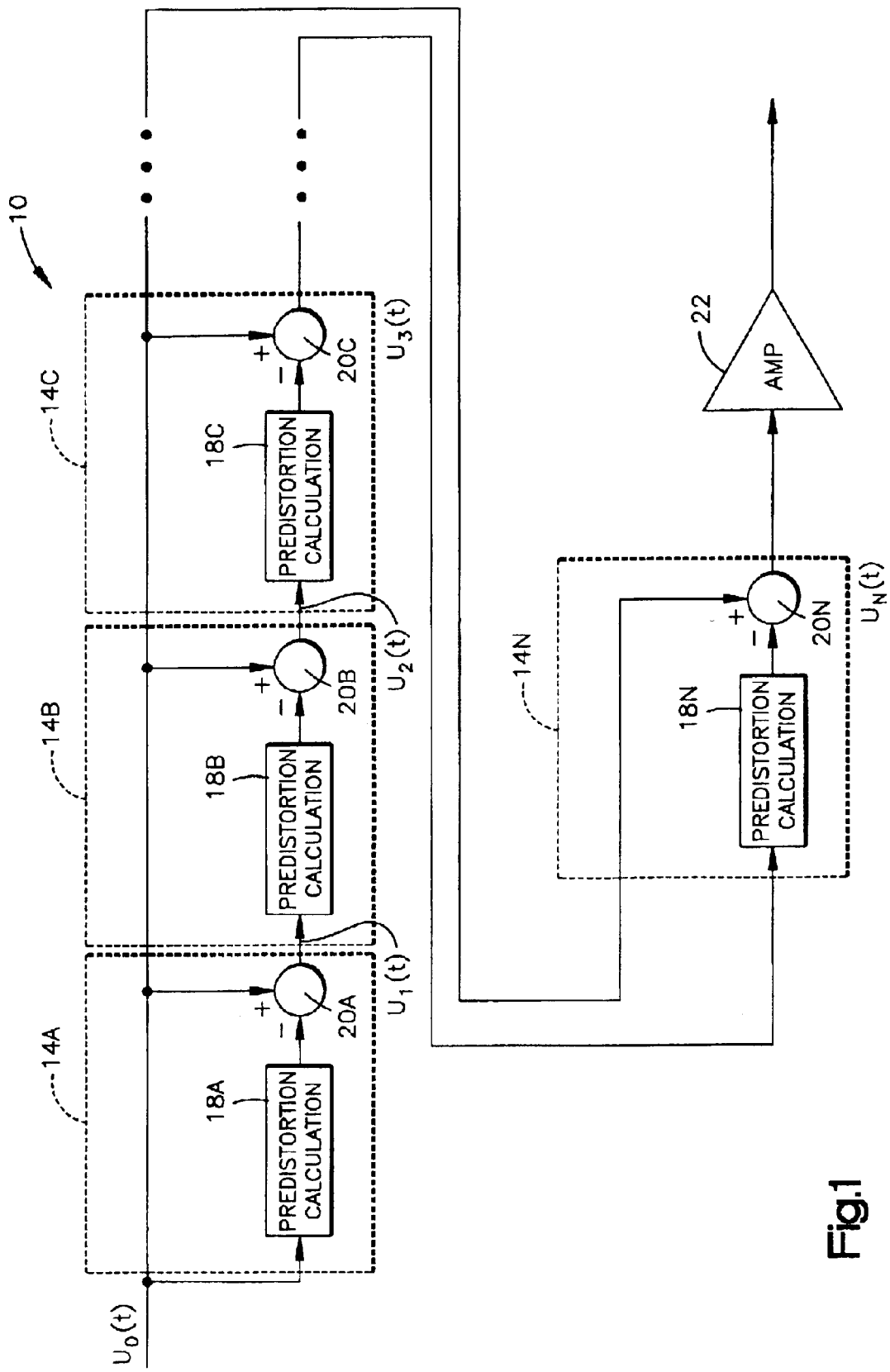
FIG. 1 is a functional block diagram of the present invention.

FIG. 1 illustrates the iterative predistorter 10 of the present invention. The input signal $U_o(t)$ is passed to a cascade of correction elements 14A–14N. The number of correction elements will vary with the application. While the accuracy of the predistortion will increase with the number of correction elements used, additional correction elements will increase the cost, complexity, and overall delay of the system.

The correction elements can be implemented in several ways. An analog set-up is feasible, where the precorrection is calculated by running the signal through a model amplifier and subtracting the original signal from the calculated signal. Alternatively, an appropriate correction term for a given input signal can be retrieved from a look-up table at each stage. In an example embodiment, the correction stages are implemented as digital signal processing devices (DSP). Accordingly, the elements and components described below may be conceptualized as functional blocks with the processor, as opposed to physical components of the system.

Each correction element (e.g., 14A) includes a predistortion calculation element 18A–18N and a difference element 20A–20N. The first correction element 14A receives the input signal as input at the predistortion calculation element 18A, and outputs a distorted signal from the difference element 20A. Each correction element 14B–14N after the first receives the output of the preceding element at the predistortion calculation portion 18B–18N and samples the original signal at its difference element 20B–20N. Thus, each successive correction element 14B–14N acts to further refine the calculation of the predistortion. At the final correction element 14N, the distorted signal is provided to an amplifier 22. The distortion to the signal is intended to produce a predistorted input signal that will produce a desired output from the amplifier 22.

A predistortion calculation element 18A–18N receives an input signal and determines the amount of predistortion necessary to correct the input signal. Generally, this is accomplished by distorting the signal according to an amplifier model, and calculating the difference between the original and the distorted signal. It should be noted that each of the predistortion calculation elements 18A–18N, calculate their precorrection according to the same function, $\epsilon(U)$, which is based upon the amplifier model. The characteristics of the amplifier will vary with the application, but the amplifier model of the present invention can be stated generally as:

$y=p[U_r+\epsilon(u_r)]$, where y is the expected output value of the amplifier $u_r$ is the value of the original input signal;

$\epsilon(U_r)$ is the error expected to be introduced to the signal by the amplifier; and p is a limiter function that clips the input signal when its absolute value exceeds a predetermined threshold.

The limiter function p reflects the behavior of the amplifier near saturation. Accordingly, the threshold value of the limiter can be set to reflect the saturation point of the amplifier, or it can be set at lower value to avoid driving the amplifier into heavy saturation.

The output of the predistortion calculation portion 18 is provided as one input of a difference element 20. The original signal is sampled to provide the second input. The difference element 20 acts to subtract the calculated predistortion from the original signal. This is intended to distort the signal toward the ideal input signal for the amplifier.

At the final correction element 14N, the distorted signal is output to the amplifier 22. The amplifier 22, in accordance with the model, nullifies the distortions introduced to the input signal. The output of the amplifier is essentially a distortion free replica of the original input signal.

Figure 2:
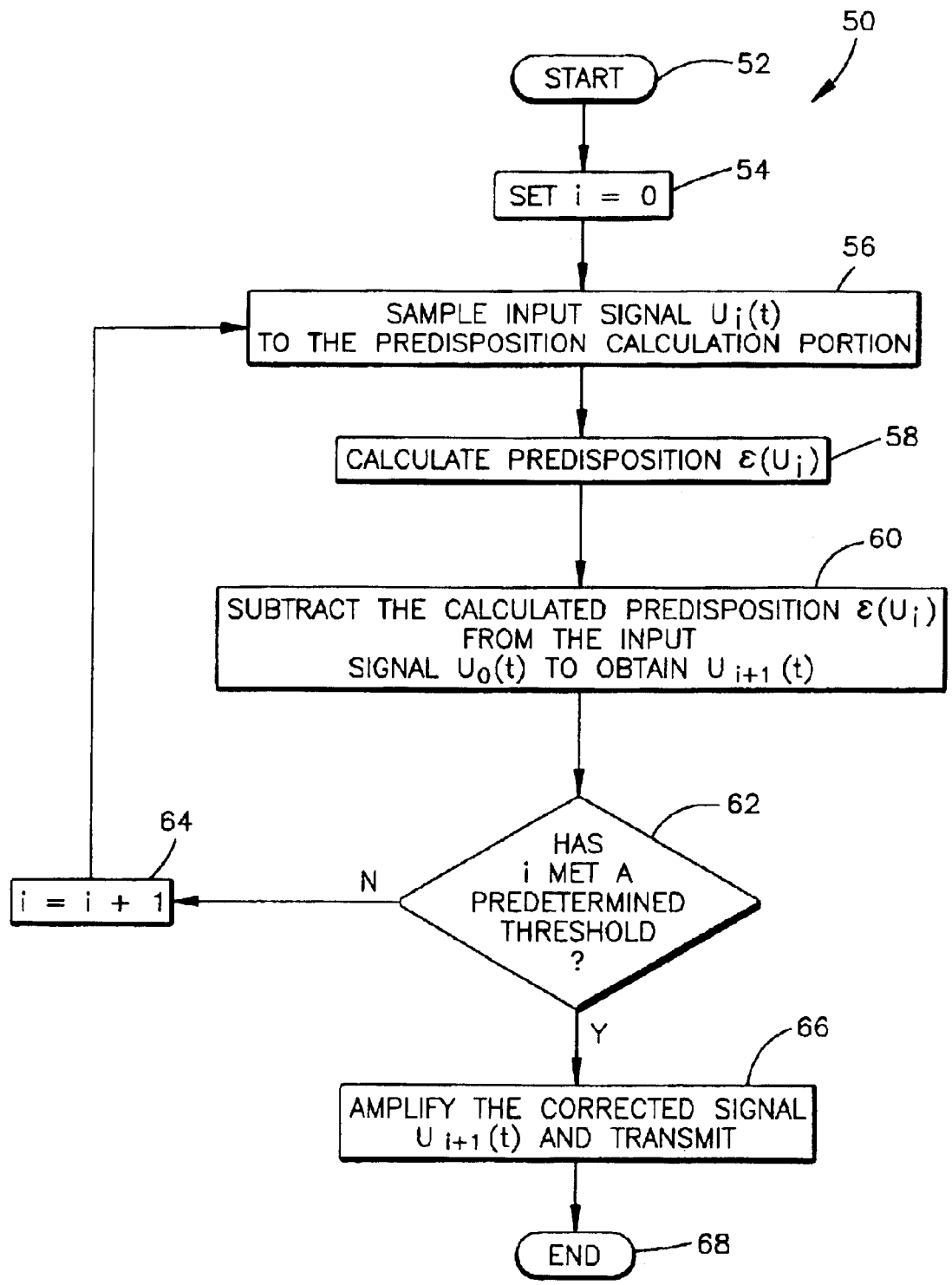
FIG. 2 is a flow diagram illustrating the operation of an example embodiment of the present invention.

FIG. 2 is a flow diagram of the run-time operation of a digital implementation of the present invention. The process 50 begins at step 52. The process then proceeds to step 54, where a counter variable, i, is initiated to a value of zero. The process then advances to step 56, where the input signal $U_i(t)$ is sampled. For i=0, this signal is the original input signal. For i>0, the sampled signal will be distorted, having undergone one or more iterations within the predistorter.

The process then advances to step 58, where the sampled input signal is predistorted using a previously estimated correction function. At step 60, the calculated predistortion is subtracted from the original input signal. As a result, the signal is precorrected as to counteract, in part, the distortion imposed by the amplifier. The process then proceeds to step 62, where the system determines if the signal has passed through a sufficient number of iterative stages. In the example embodiment, this number is a predetermined threshold, but as an alternate embodiment, the system could terminate the iterations when the difference between successive signals becomes sufficiently small. If the proper number of iterations has not been reached, the process continues to step 64. At step 64, the counter variable is incremented upwards by one, and the process returns to step 56 to begin another iteration.

Returning to the decision at step 62, if the proper number of iterations have been completed, the process progresses to step 66, where the corrected signal is amplified and transmitted. The process then terminates at step 68.

For an amplifier whose error is leading the signal (i.e. the amplifier lacks the general minimum phase property), the ideal inverse will not be causal or stable, even with the addition of the soft-limiter. This is comparable to a traditional linear non-minimum phase filter, which shows similar properties and lacks a stable inverse. To avoid this destabilizing effect, it is preferable to delay the input signal as the iterations are resolved. Thus, the accuracy of this model comes at a trade-off when dealing with an amplifier lacking general minimum phase characteristics; a stable model can be achieved and made indefinitely accurate, but at the cost of increasing the associated delay.

Figure 3:
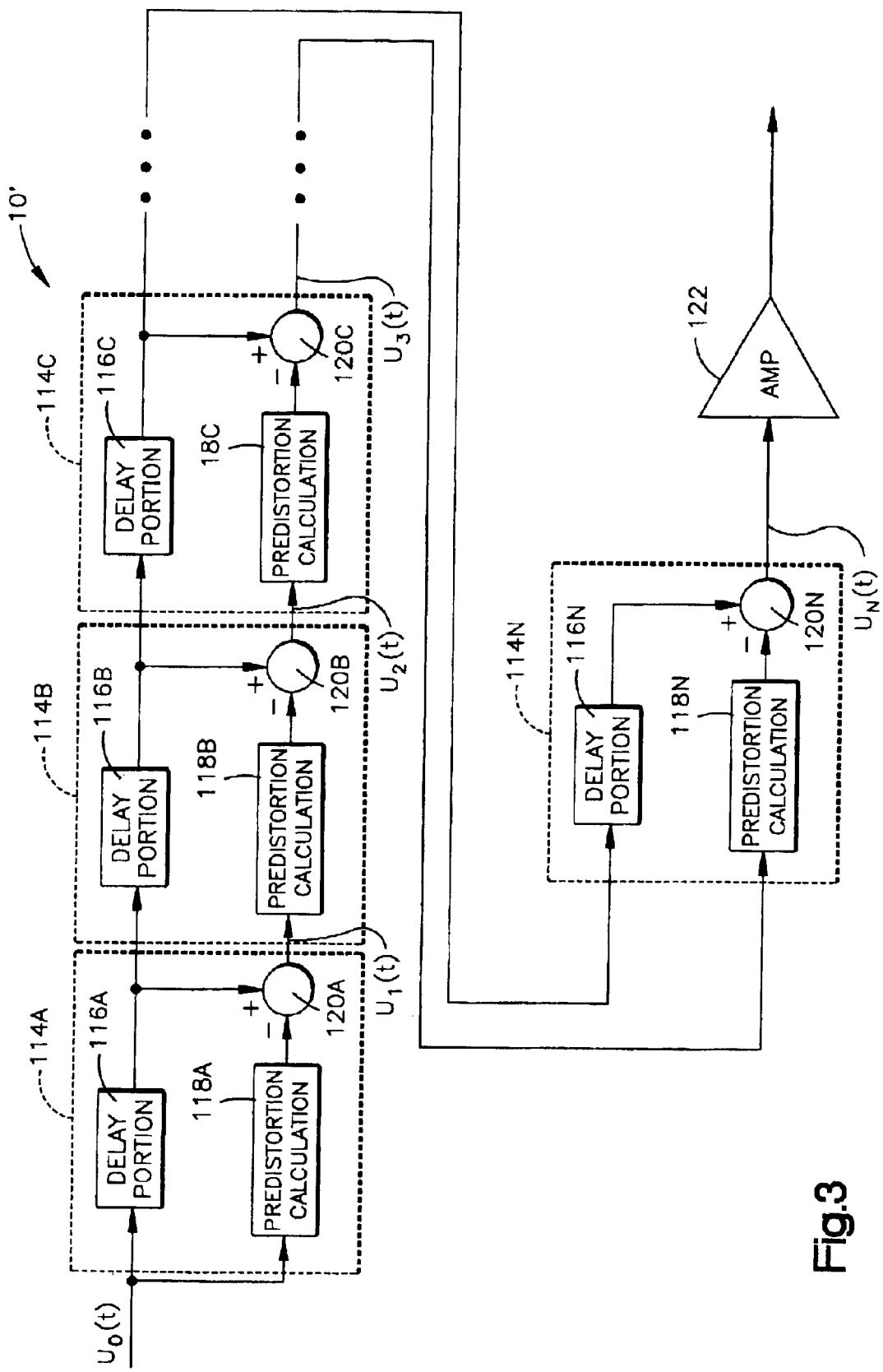
FIG. 3 is a functional block diagram of an alternate embodiment of the present invention.

FIG. 3 illustrates an alternate embodiment 10' of the iterative predistorter incorporating the delay discussed above. As before, the input signal $U_o(t)$ is passed to a cascade of correction elements 114A–114N. With the addition of the delay, each correction element (e.g., 114A) can be envisioned as containing three basic components: a delay element 116A–116N, a predistortion calculation element 118A–118N, and a difference element 120A–120N. The first correction element 14A receives the input signal as input at both the delay element and the predistortion calculation element. It outputs both a delayed signal from the delay portion 116A and a distorted signal from the difference element 120A. Each correction element 114B–114N after the first receives the outputs of the preceding element as its inputs. Thus, each successive correction element 114B–114N acts to further delay the delayed signal and refine the calculation of the distortion. At the final correction element 114N, the distorted signal is provided to an amplifier 122. The distortion to the signal is intended to produce an ideal input signal that will produce a desired output from the amplifier 122.

The delay elements 116A–116N impose a time delay of a predetermined period on the original input signal $U_o(t)$. This occurs at each correction element 114A–114N, such that the delayed output of the $N^{th}$ correction element will be delayed by a period equal to N times the predetermined period. In an analog embodiment of the system, the delay may by imposed via a transmission line, a filter, or a similar time delaying device.

A predistortion calculation element 118A–118N receives an input signal and determines the amount of predistortion necessary to correct the input signal. Generally, this is accomplished by distorting the signal according to an amplifier model, and calculating the difference between the original and the distorted signal. It should be noted that each of the predistortion calculation elements 18A–18N, calculate their precorrection according to the same function, $\epsilon(U)$, which is based upon the amplifier model. The characteristics of the amplifier will vary with the application, but the amplifier model of the present embodiment can be stated generally as:

y=p[$U_{t-D}$+$\epsilon(U_t)$], where y is the expected output value of the amplifier $U_t$ is the value of the original input signal;

$U_{t-d}$ is the value of the input signal after the predetermined period of delay;

$\epsilon(U_t)$ is the error expected to be introduced to the signal by the amplifier; and p is the limiter function that clips the input signal when its absolute value exceeds a predetermined threshold.

As before, the output of the predistortion calculation portion is provided as one input of a difference element 120. The second input is now provided by the delayed signal provided by the delay portion. The difference element 120 acts to subtract the calculated predistortion from the delayed signal. This is intended to distort the signal toward the ideal input signal for the amplifier.

At the final correction element 114N, the distorted signal is output to the amplifier 122. The amplifier 122, in accordance with the model, nullifies the distortions introduced to the input signal. The output of the amplifier is essentially a distortion free replica of the original input signal.

Figure 4:
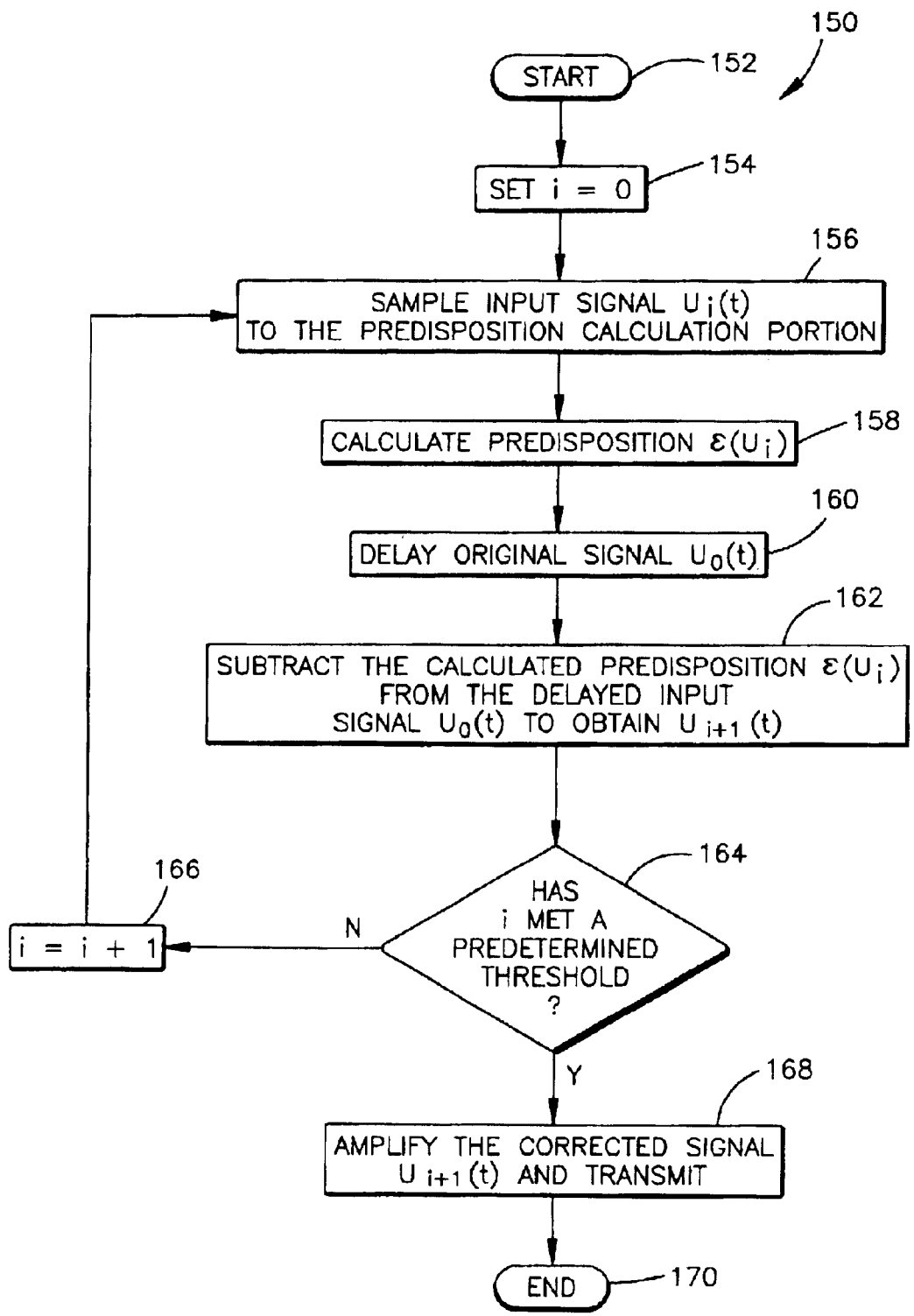
FIG. 4 is a flow diagram illustrating the operation of an alternate embodiment of the present invention.

FIG. 4 is a flow diagram of the run-time operation of a digital implementation of an alternate embodiment of the present invention incorporating a delay between iterative stages. The process 150 begins at step 152. The process when proceeds to step 154, where a counter variable, i, is initiated to a value of zero. The process then advances to step 156, where the input signal $u_t(t)$ is sampled. For i=0, this signal is the original input signal. For i>0, the sampled signal will be delayed and distorted, having undergone one or more iterations within the predistorter.

The process then advances to step 158, where the sampled input signal is used to calculate a predistortion value based on the amplifier model. This value represents the amount of predistortion necessary to counteract the distorting effects of the amplifier. The process then proceeds to step 160, where the original signal is delayed for a predetermined period of time.

At step 162, the calculated final value from the iterative predistortion process is subtracted from the delayed input signal. As a result, the signal is precorrected as to counteract, in part, the distortion imposed by the amplifier. The process then proceeds to step 164, where the system determines if the signal has passed through a sufficient number of iterative stages.

In the example embodiment, this number is a predetermined threshold, but as an alternate embodiment, the system could terminate the iterations when the difference between successive signals becomes sufficiently small. If the proper number of iterations has not been reached, the process continues to step 166. At step 166, the counter variable is incremented upwards by one, and the process returns to step 156 to begin another iteration.

Returning to the decision at step 164, if the proper number of iterations have been completed, the process progresses to step 168, where the corrected signal is amplified and transmitted. The process then terminates at step 170.

Figure 5:
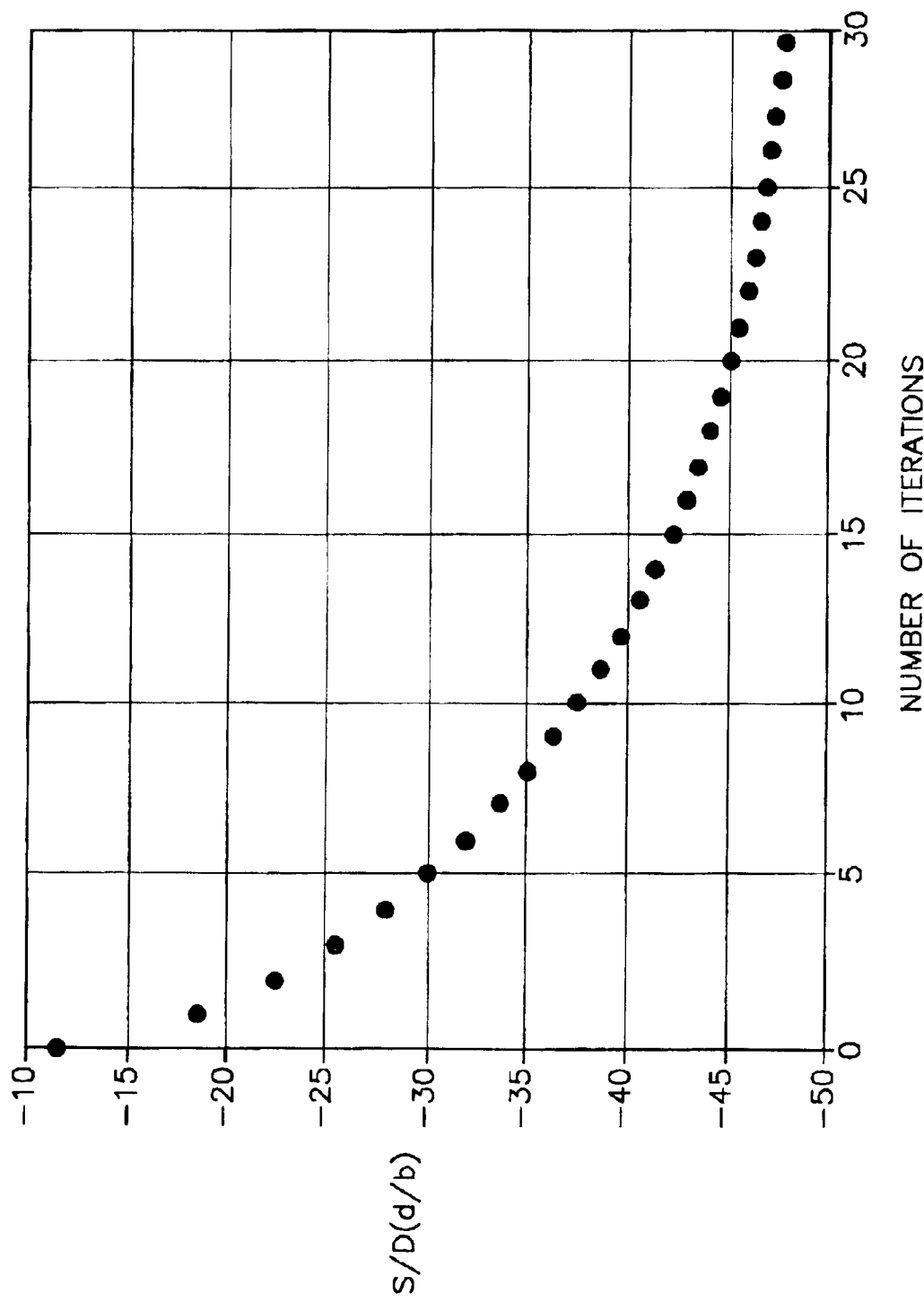
FIG. 5 is a graph showing the improvement in signal-to-distortion ratio in the present invention with the increase in the number of iterative stages used in the predistorter.

Some amount of error will remain in the amplified signal, the degree of error varying inversely with the number of correction elements used. FIG. 5 illustrates the results of experimentation with a sample non-linear amplifier model with non-minimum phase characteristics:

$$y_t = \frac{x_{t-1}}{|x_{t-1}|} \arctan(|x_{t-1}| + |0.1 x_t|) *$$

$$\left[1 - 0.1 \arctan\left(\sum_{i=1}^{9} |x_{t-i}^f|\right)\right] e^{j(0.1|x_{t-1}|+0.1|x_t|)/(1+|x_{t-1}|)}$$

The graph shows signal-to-distortion ratio in decibels (dB) as a function of the number of iterations (i.e. correction stages) used in the predistorter. As the graph makes apparent, the signal-to-distortion ratio of the amplified signal decreases from around −11 dB for the uncorrected signal to −30 dB for a signal corrected through five iterations of the predistorter. In other words, the signal-to-distortion ratio is improved by nearly a factor of ten. Further iterations result in increased gains, with a reduction to −47 dB at thirty iterations. As FIG. 5 illustrates, so long as the system can accept a sufficiently large delay, the quality of the signal can be improved almost indefinitely.

Figure 6:
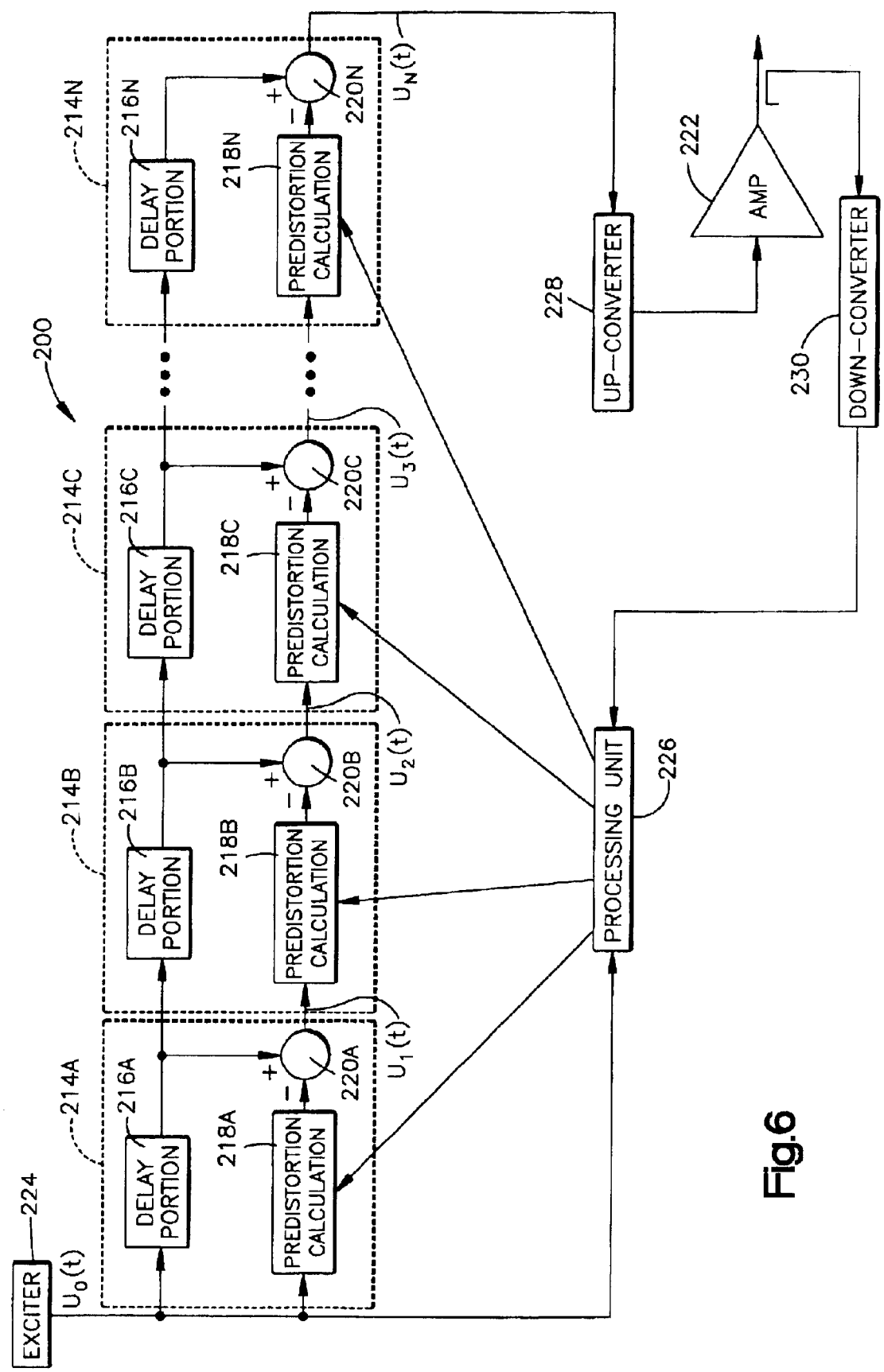
FIG. 6 is a functional diagram of an embodiment of the present invention in an adaptive predistortion system.

FIG. 6 illustrates the predistorter of the present invention embodied in a communications system 200 with adaptive predistortion. The adaptive predistortion of this embodiment may be used successfully with either the initial embodiment introduced in FIG. 1 or the alternate embodiment of FIG. 3 that incorporates delays between the iterative stages. FIG. 6 contains a number of components in common with FIGS. 1 and 3, and discussion of these common components will be omitted except as they relate to the particular functions of the illustrated embodiment.

Turning to the illustrated embodiment, the input signal is provided by an exciter 224. The signal is iteratively precorrected using a series of correction elements 214A–214N. Each correction element 214A–214N is controlled by a processing unit 226. The processing unit samples the input signal and the output of the amplifier 222, and estimates the amount of predistortion necessary to counteract the distortion introduced during amplification of the signal. This estimation is then provided to the correction elements 214A–214N to refine the precorrection of the signal. In the example embodiment, the processing unit 226 is implemented as a digital signal processor.

After the signal is predistorted, it is passed to an up-converter 228. Here, the signal is up-converted and passed to the amplifier 222. The output of the amplifier is sampled through a down-converter 230 to the processing unit 226 for comparison with the original input signal. The results of this comparison are used to provide an accurate estimation of the amplifier error for the iterative predistortion.

Figure 7:
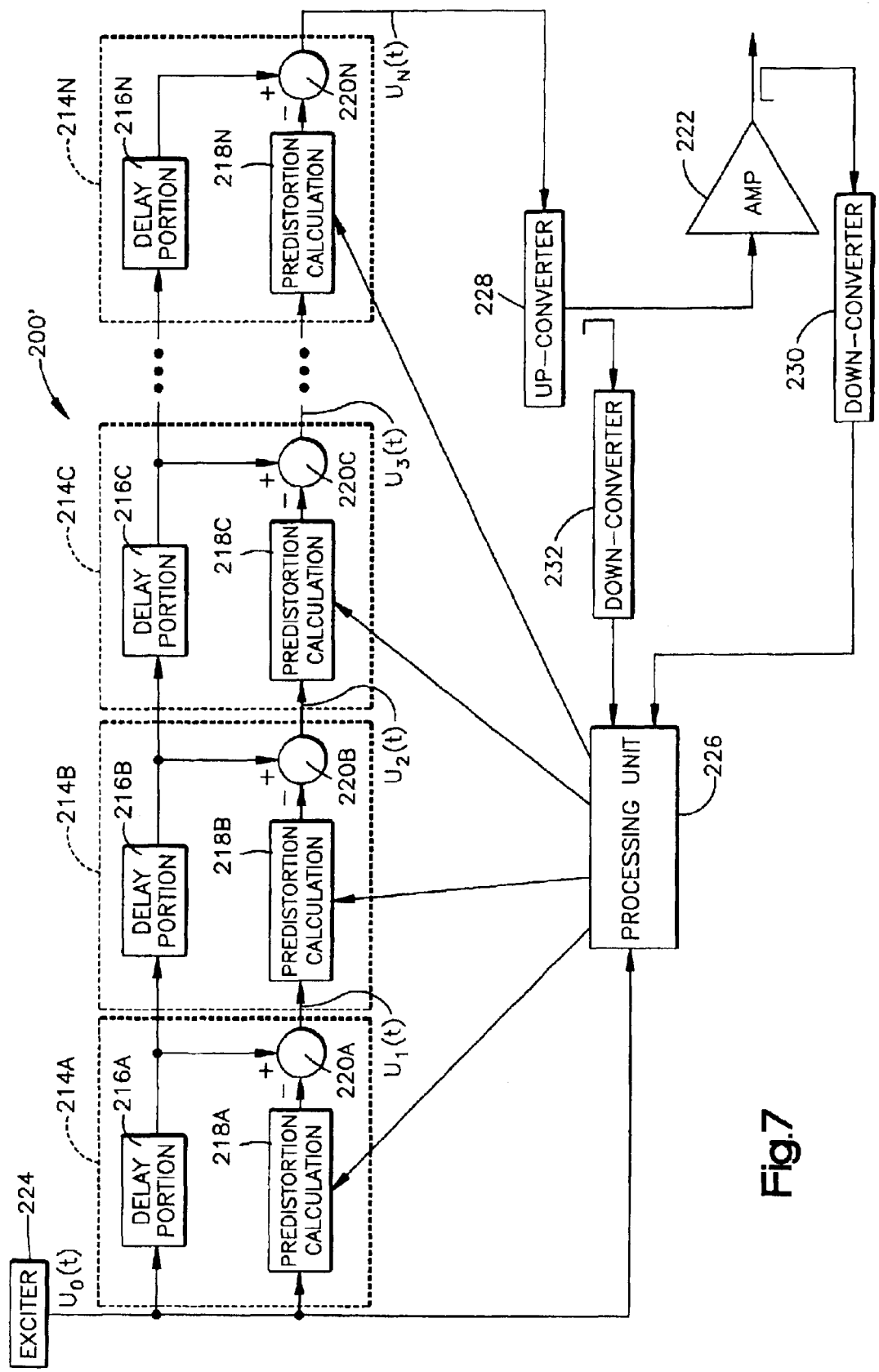
FIG. 7 is a functional diagram of an alternate embodiment of the present invention in an adaptive predistortion system.

FIG. 7 illustrates the claimed predistorter embodied in an alternative communications system 200' with adaptive predistortion. FIG. 7 contains a number of components in common with FIG. 6. Discussion of these common components will be omitted except as they relate to the particular functions of the illustrated embodiment. The numbering of these components will remain unchanged.

Turning to the illustrated embodiment, the input signal is provided by an exciter 224. The signal is iteratively precorrected at a series of correction elements 214A–214N. Each correction element 214A–214N is controlled by a processing unit 226. The processing unit samples the up-converted output of the final correction element 214N and the output of the amplifier 222. As before, the processing unit 226 is implemented as a digital signal processor in the example embodiment.

After the signal is predistorted, it is passed to an up converter 228. The up-converted signal is sampled to the processing unit 226 through a down-converter 232, and passed to the amplifier 222. The output of the amplifier is sampled through a second down-converter 230 to the processing unit 226 for comparison with the predistorter output. The results of this comparison are used to provide an accurate estimation of the amplifier error to the correction elements 214A–214N.

Figure 8:
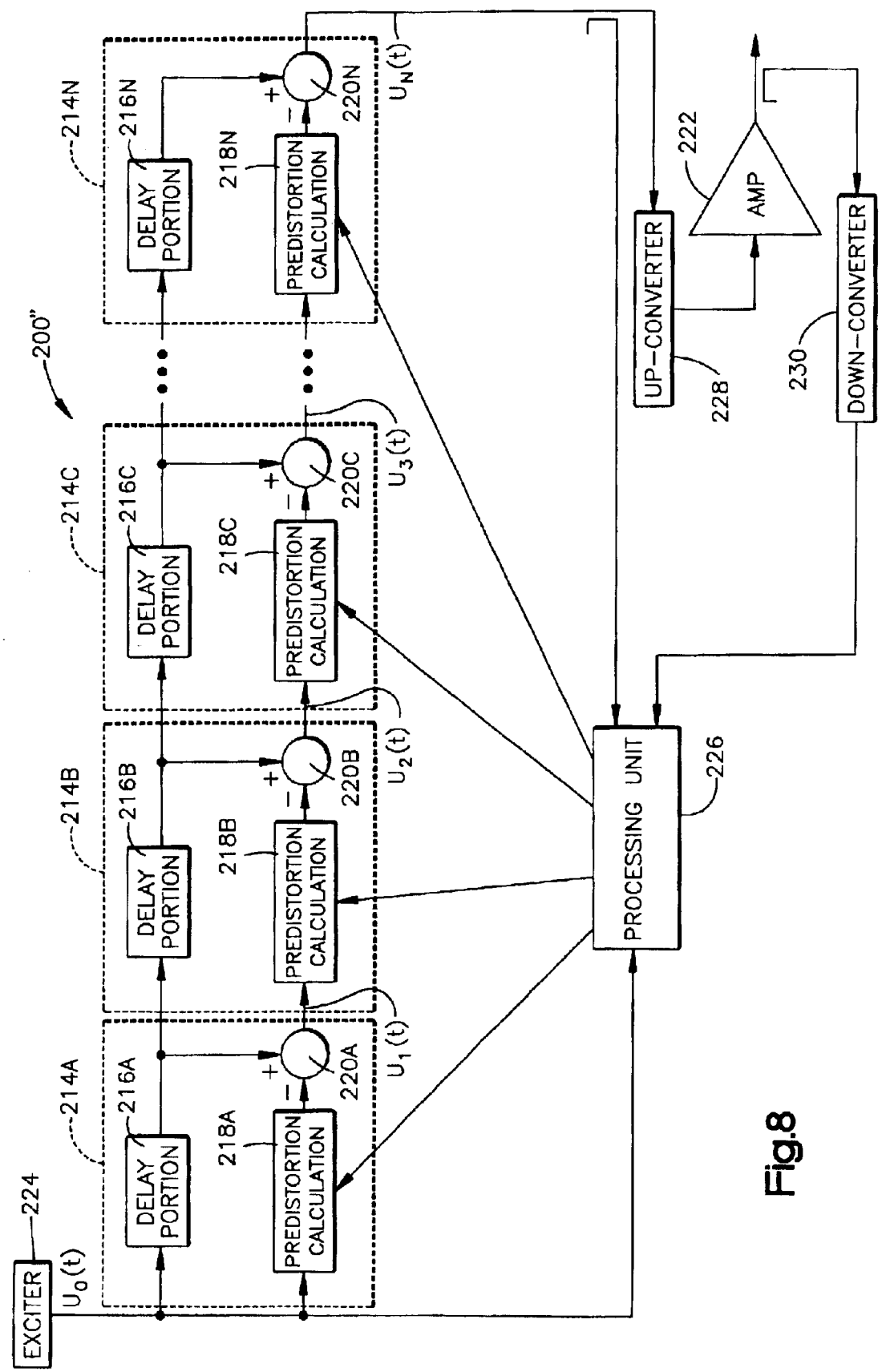
FIG. 8 is a functional diagram of another alternate embodiment of the present invention in an adaptive predistortion system.

FIG. 8 illustrates the claimed predistorter embodied in a third communications system 200" with adaptive predistortion. FIG. 8 contains a number of components in common with FIG. 7. Discussion of these common components will be omitted except as they relate to the particular functions of the illustrated embodiment. The numbering of these components will remain unchanged.

Turning to the illustrated embodiment, the input signal is provided by an exciter 224. The signal is iteratively precorrected at a series of correction elements 214A–214N. Each correction element 214A–214N is controlled by a processing unit 226. The processing unit samples the output of the final correction element 214N and the output of the amplifier 222. As before, the processing unit 226 is implemented as a digital signal processor in the example embodiment.

After the signal is predistorted, it is sampled to the processing unit 226. It is then passed to an up-converter 228, which up-converts the signal and passes it to the amplifier 222. The output of the amplifier is sampled through a down-converter 230 to the processing unit 226 for comparison with the predistorter output. The results of this comparison are used to provide an accurate estimation of the amplifier error to the error correction elements 214A–214N.

It will be understood that the above description of the present invention is susceptible to various modifications, changes and adaptations, and the same are intended to be comprehended within the meaning and range of equivalents of the appended claims. The presently disclosed embodiments are considered in all respects to be illustrative, and not restrictive. The scope of the invention is indicated by the appended claims, rather than the foregoing description, and all changes that come within the meaning and range of equivalence thereof are intended to be embraced therein.

Having described the invention, we claim the following:

1. A method for predistorting an input signal to a non-linear amplifier, said method comprising:
    determining a precorrection for the input signal according to an amplifier model;
    iteratively repeating the following steps until a termination event occurs:
        applying a determined precorrection to the original input signal to produce a corrected signal; and
        determining a new precorrection for the input signal according to the amplifier model and the corrected signal;
    applying the determined precorrection to the original input signal to produce an output signal; and
    providing the output signal to the non-linear amplifier.

2. A method as set forth in claim 1, wherein the method further comprises the step of delaying the original input signal during each iteration.

3. A method as set forth in claim 2, wherein the amplifier model is not of general minimum phase.

4. A method as set forth in claim 1, wherein the step of determining a new precorrection for the input signal comprises the step of estimating the signal error induced by the amplifier at a processing unit.

5. A method as set forth in claim 4, wherein estimating the signal error includes sampling the output of the amplifier.

6. A method as set forth in claim 5, wherein estimating the signal error includes sampling the input signal before a precorrection has been applied.

7. A method as set forth in claim 5, wherein estimating the signal error includes sampling the output signal.

8. A method as set forth in claim 7, wherein the output signal is up-converted prior to sampling.

9. A method for predistorting an input signal to a non-linear amplifier, said method comprising:
    determining a precorrection for the input signal according to an amplifier model;
    iteratively repeating the following steps until a termination event occurs:
        delaying the input signal;
        applying the determined precorrection to the delayed input signal to produce a corrected signal; and
        determining a new precorrection for the delayed input signal according to the amplifier model and the corrected signal;
    applying the determined precorrection to the delayed input signal to produce an output signal; and
    providing the output signal to the non-linear amplifier.

10. A method as set forth in claim 9, wherein the amplifier model includes a limiting function that clips the input signal to reduce error due to amplifier saturation.

11. A method as set forth in claim 9, wherein the amplifier model is not of general minimum phase.

12. A method as set forth in claim 9, wherein the method further comprises the step of estimating the signal error induced by the amplifier at a processing unit.

13. A method as set forth in claim 12, wherein estimating the signal error includes sampling the output of the amplifier.

14. A method as set forth in claim 13, wherein estimating the signal error includes sampling the input signal before the input signal has been delayed.

15. A method as set forth in claim 13, wherein estimating the signal error includes sampling the output signal.

16. A method as set forth in claim 15, wherein the output signal is up-converted prior to sampling.

17. An apparatus for predistorting an input signal to a non-linear amplifier, comprising:
    a first correction element [s] including:
        a first predistortion calculation portion that receives the original input signal as an input and determines an appropriate first precorrection for the input signal according to an amplifier model and the original input signal; and
a first difference element that applies the determined first precorrection to the input signal to produce a first corrected signal; and
a second correction element including:
a second predistortion calculation portion that receives the first corrected input signal as an input and determines an appropriate second precorrection for the input signal according to the amplifier model and the first corrected signal; and
a second difference element that applies the second determined precorrection to the original input signal to produce a second corrected signal.

18. An apparatus as set forth in claim 17, wherein each of the first and second correction elements further includes a delay portion that delays the input signal.

19. An apparatus as set forth in claim 18, wherein the amplifier model is not of general minimum phase.

20. An apparatus as set forth in claim 17, wherein the apparatus further comprises a processing unit that estimates the signal error induced by the amplifier and provides this estimate to the first and second correction elements.

21. An apparatus as set forth in claim 20, wherein estimating the signal error includes sampling the output of the amplifier.

22. An apparatus as set forth in claim 21, wherein estimating the signal error includes sampling the input signal before it has been input into the first a correction element.

23. An apparatus as set forth in claim 21, wherein estimating the signal error includes sampling the respective outputs of the first and second correction elements.

24. An apparatus as set forth in claim 21, wherein the apparatus further comprises an up-converter and estimating the signal error includes sampling the output of the up-converter.

25. An apparatus for predistorting an input signal to a non-linear amplifier, comprising:
a series of correction elements, each including:
a predistortion calculation portion that determines an appropriate precorrection for a signal input into the correction element according to an amplifier model;
a delay portion that delays the input signal; and
a difference element that applies the determined precorrection to the delayed input signal.

26. An apparatus as set forth in claim 25, wherein the amplifier model includes a limiting function that clips the input signal to reduce error due to amplifier saturation.

27. An apparatus as set forth in claim 25, wherein the amplifier model is not of general minimum phase.

28. An apparatus as set forth in claim 25, wherein the apparatus further comprises a processing unit that estimates the signal error induced by the amplifier and provides this estimate to the correction elements.

29. An apparatus as set forth in claim 28, wherein estimating the signal error includes sampling the output of the amplifier.

30. An apparatus as set forth in claim 29, wherein estimating the signal error includes sampling the input signal before it has been input into a correction element.

31. An apparatus as set forth in claim 29, wherein estimating the error includes sampling the output of the correction elements.

32. An apparatus as set forth in claim 29, wherein the apparatus further comprises an up-converter and estimating the signal error includes sampling the output of the up-converter.

* * * * *